(12) United States Patent
Huang

(10) Patent No.: US 11,386,943 B2
(45) Date of Patent: Jul. 12, 2022

(54) WRITE PROTECTION CIRCUIT FOR MEMORY AND DISPLAY APPARATUS

(71) Applicant: HKC Corporation Limited, Guangdong (CN)

(72) Inventor: Beizhou Huang, Guangdong (CN)

(73) Assignee: HKC Corporation Limited, Shenzhen (CN)

(*) Notice: Subject to any disclaimer, the term of this patent is extended or adjusted under 35 U.S.C. 154(b) by 56 days.

(21) Appl. No.: 17/035,755

(22) Filed: Sep. 29, 2020

(65) Prior Publication Data

US 2021/0020211 A1 Jan. 21, 2021

Related U.S. Application Data

(63) Continuation of application No. PCT/CN2018/115778, filed on Nov. 16, 2018.

(30) Foreign Application Priority Data

Sep. 14, 2018 (CN) .......................... 201811083705.9

(51) Int. Cl.
*G11C 7/24* (2006.01)
*G09G 3/20* (2006.01)
(52) U.S. Cl.
CPC ........ *G11C 7/24* (2013.01); *G09G 3/20* (2013.01)
(58) Field of Classification Search
CPC .................................... G11C 7/24; G09G 3/20
See application file for complete search history.

(56) References Cited

U.S. PATENT DOCUMENTS

| 9,466,385 | B1* | 10/2016 | Hayter | ................ | G11C 16/22 |
| 10,732,863 | B2* | 8/2020 | Kodera | ............... | G06F 12/1425 |
| 10,755,789 | B1* | 8/2020 | Kao | ........................ | G11C 7/24 |
| 2018/0174629 | A1* | 6/2018 | Seong | ................ | G11C 13/0059 |

FOREIGN PATENT DOCUMENTS

| CN | 2678275 | Y | 2/2005 |
| CN | 101089997 | A | 12/2007 |
| CN | 201117293 | Y | 9/2008 |
| CN | 102446141 | A | 5/2012 |
| CN | 106463157 | A | 2/2017 |
| CN | 106971108 | A | 7/2017 |
| CN | 207182913 | U | 4/2018 |
| JP | 2008140018 | A | 6/2008 |

OTHER PUBLICATIONS

International Search Report of PCT Patent Application No. PCT/CN2018/115778 dated May 29, 2019.

* cited by examiner

*Primary Examiner* — Tuan T Nguyen

(57) ABSTRACT

A write protection circuit for memory and a display apparatus are provided. The write protection circuit includes an interference signal absorbing circuit connected with a data writing triggering terminal to absorb a first level signal when the receiving of the first level signal by the data writing triggering terminal is detected.

20 Claims, 2 Drawing Sheets

WRITE PROTECTION CIRCUIT FOR MEMORY AND DISPLAY APPARATUS

CROSS-REFERENCE OF RELATED APPLICATIONS

The present application is a continuation application of International Application with No. PCT/CN2018/115778, filed on Nov. 16, 2018, which claims the benefit of a Chinese Patent Application with No. 201811083705.9, titled "WRITE PROTECTION CIRCUIT FOR MEMORY AND DISPLAY APPARATUS", filed in the National Intellectual Property Administration, PRC on Sep. 14, 2018, the entire contents of which are hereby incorporated by reference.

FIELD OF THE DISCLOSURE

The present disclosure relates to the field of electronic circuit technologies, and in particular, to a write protection circuit for memory and a display apparatus.

BACKGROUND OF THE DISCLOSURE

In a display apparatus, generally, data stored in a Static Read Only Memory (SROM) inside a Timing Controller Integrated Circuit (TCON IC) cannot be stored any longer after a power failure, whereas data stored in an Electrically Erasable Programmable Read Only Memory (EEPROM) or a Flash can be stored even after a power failure, therefore, a control program of a timing controller is stored in an external EEPROM or Flash.

Data in the memory cannot be modified when the display apparatus functions normally, and once the data is modified, an error occurs in set data, leading to an abnormal display of the display apparatus. However, a write protection pin of a memory is connected with a communication bus, an interference signal on the communication bus may pull up a write protection pin signal of the memory, resulting in that data in the memory is rewritten.

SUMMARY OF THE DISCLOSURE

A main objective of the present disclosure is to provide a write protection circuit for memory and a display apparatus to prevent software codes in the memory from being rewritten.

To achieve the foregoing objective, the present disclosure provides a write protection circuit for memory, which includes:

a data writing triggering terminal connected with a write protection pin of a memory and configured to receive a first level signal for controlling the memory to enter into a write state;

a write protection controlling circuit connected with the write protection pin of the memory and configured to provide the write protection pin of the memory with a second level signal for restricting the memory from being written with data, wherein the second level signal is opposite in polarity to the first level signal; and an interference signal absorbing circuit connected with the data writing triggering terminal and configured to detect a level signal received by the data writing triggering terminal when the memory functions normally and absorb the first level signal when the receiving of the first level signal by the data writing triggering terminal is detected.

In one embodiment, the interference signal absorbing circuit is specifically configured to detect the level signal received by the data writing triggering terminal when a first control signal representing a normal functioning of the memory is received and absorb the first level signal when the receiving of the first level signal by the data writing triggering terminal is detected.

In one embodiment, the interference signal absorbing circuit includes a first switch tube and a first resistor, an input terminal of the first switch tube is connected with the data writing triggering terminal and a first terminal of the first resistor, a second terminal of the first resistor is connected with a controlled terminal of the first switch tube, and an output terminal of the first switch tube is grounded.

In one embodiment, the first switch tube is an N-MOS tube.

In one embodiment, the write protection circuit for memory further includes a power input terminal, wherein the interference signal absorbing circuit includes a second switch tube and a second resistor, an input terminal of the second switch tube is connected with the data writing triggering terminal, a controlled terminal of the second switch tube is connected with the power input terminal via the second resistor, and an output terminal of the second switch tube is grounded.

In one embodiment, the power input terminal is connected in parallel with a power input terminal of the memory to receive a power supply of the memory.

In one embodiment, the second switch tube is an N-MOS tube.

In one embodiment, the write protection circuit for memory further includes a current limiting element, which is connected in series between the data writing triggering terminal and the write protection pin of the memory.

In one embodiment, the current limiting element is a third resistor, which is connected in series between the data writing triggering terminal and the write protection pin of the memory.

In one embodiment, the write protection controlling circuit further includes a fourth resistor, which is connected in series between the write protection pin of the memory and the earth.

In one embodiment, the third resistor and the fourth resistor are connected in series.

In one embodiment, the third resistor and the fourth resistor are configured to control, when the data writing triggering terminal is connected with an upper machine via an I2C communication bus and an electric connector and supplies a high-level write protection triggering signal to the write protection pin of the memory, an output of a high-level signal to the write protection pin to trigger the memory to enter into a writable state.

In one embodiment, a ratio of a resistance of the third resistor to that of the fourth resistor is 1:12-1:6.

In one embodiment, a ratio of a resistance of the third resistor to that of the fourth resistor is 1:10.

The present disclosure also provides a write protection circuit for memory, the write protection circuit includes:

a first resistor connected with a write protection pin of a memory and configured to input a low-level write control signal to the write protection pin of the memory when the memory functions normally;

a data writing triggering terminal connected with the write protection pin of the memory and configured to output a received high-level write protection triggering signal to the write protection pin of the memory when the memory is updated in data; and an interference signal absorbing circuit connected with the data writing triggering terminal, and configured to detect a level signal received by the data writing triggering terminal when the memory functions normally and absorb a first level signal when the receiving of the first level signal by the data writing triggering terminal is detected.

The present disclosure further provides a display apparatus which includes a write protection circuit for memory, where, the write protection circuit for memory includes:

a data writing triggering terminal connected with a write protection pin of a memory and configured to receive a first level signal for controlling the memory to enter into a write state;

a write protection controlling circuit connected with the write protection pin of the memory and configured to provide the write protection pin of the memory with a second level signal for restricting the memory from being written with data, wherein the second level signal is opposite in polarity to the first level signal; and an interference signal absorbing circuit connected with the data writing triggering terminal and configured to detect a level signal received by the data writing triggering terminal when the memory functions normally and absorb the first level signal when the receiving of the first level signal by the data writing triggering terminal is detected.

In one embodiment, the display apparatus further includes an Inter-Integrated Circuit (I2C) communication bus and a timing controller, wherein the memory is connected with the timing controller via the I2C communication bus.

In one embodiment, the display apparatus further includes a display panel, a source drive integrated circuit and a gate drive integrated circuit, wherein the timing controller is connected with the source drive integrated circuit and the gate drive integrated circuit, and the source drive integrated circuit and the gate drive integrated circuit are also connected with the display panel.

In one embodiment, the interference signal absorbing circuit is specifically configured to detect the level signal received by the data writing triggering terminal when a first control signal representing a normal functioning of the memory is received and absorb the first level signal when the receiving of the first level signal by the data writing triggering terminal is detected.

In one embodiment, the write protection circuit for memory further includes a power input terminal, the interference signal absorbing circuit includes a second switch tube and a second resistor, an input terminal of the second switch tube is connected with the data writing triggering terminal, a controlled terminal of the second switch tube is connected with the power input terminal via the second resistor, and an output terminal of the second switch tube is grounded.

The write protection controlling circuit for memory disclosed herein is provided with a write protection controlling circuit, which is connected with a write protection pin of a memory to input, when the memory functions normally, a write control signal to the write protection pin of the memory, and a data writing triggering terminal and a write protection triggering signal output terminal, which are connected with an electric connector and the write protection pin of the memory, respectively, to output, when data in the memory is updated, a received write protection triggering signal to the write protection pin of the memory; the write protection controlling circuit for memory is also provided with an interference signal absorbing circuit, and input terminal of which is connected with the data writing triggering terminal to absorb, when a display apparatus is powered on and functions normally, an interference signal fleeing from an I²C communication bus to the data writing triggering terminal. The present disclosure addresses the problem that because a level of a write protection pin of a memory is pulled up by an interference signal, an interference signal on an I²C communication bus is supplied to a data transmission pin (a clock pin and a data pin) of the memory through the I²C communication bus and rewrites software codes of the memory. The present disclosure is capable of effectively preventing software codes of a memory from being rewritten.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only about some embodiments of the present disclosure, and persons of ordinary skill in the art can derive other drawings from the accompanying drawings without creative efforts.

Labels illustration for drawings.

| Label | Name |
|-------|------|
| WP-I | data writing triggering terminal |
| 100 | Memory |
| 10 | write protection controlling circuit |
| 20 | Interference signal absorbing circuit |
| R1-R4 | First resistor-Fourth resistor |
| WP | Write protection pin |
| Q1 | First switch tube |
| Q2 | Second switch tube |

The realizing of the objective, functional characteristics and advantages of the present disclosure are further described in detail with reference to the accompanying drawings when taken in conjunction with the embodiments.

DETAILED DESCRIPTION OF THE EMBODIMENTS

The technical solutions of the embodiments of the present disclosure will be clearly and completely described in the following with reference to the accompanying drawings. It is obvious that the embodiments to be described are only a part rather than all of the embodiments of the present disclosure. All other embodiments obtained by persons of ordinary skill in the art based on the embodiments of the present disclosure without creative efforts shall fall within the scope of protection of the present disclosure.

It is to be understood that, all of the directional instructions in the exemplary embodiments of the present disclosure (such as top, down, left, right, front, back . . . . . . ) can only be used for explaining relative position relations, moving condition of the elements under a special form (referring to figures), and so on, if the special form changes, the directional instructions changes accordingly.

In addition, the descriptions, such as the "first", the "second" in the present disclosure, can only be used for describing the aim of description, and cannot be understood as indicating or suggesting relative importance or impliedly indicating the number of the indicated technical character. Therefore, the character indicated by the "first", the "second" can express or impliedly include at least one character. In addition, the technical solutions of different embodiments can be combined with each other on the condition that the combined technical solution can be realized by persons of ordinary skill in the art, when the combination of the technical solutions occurs contradiction or cannot be realized, it should consider that the combination of the technical solutions is impracticable, and is not contained in the scope of protection claimed by the present disclosure.

The present disclosure provides a write protection circuit for memory, which is applicable to being used in a display apparatus equipped with a display panel, for example, a television, a mobile phone, a computer, and the like.

Figure 1:
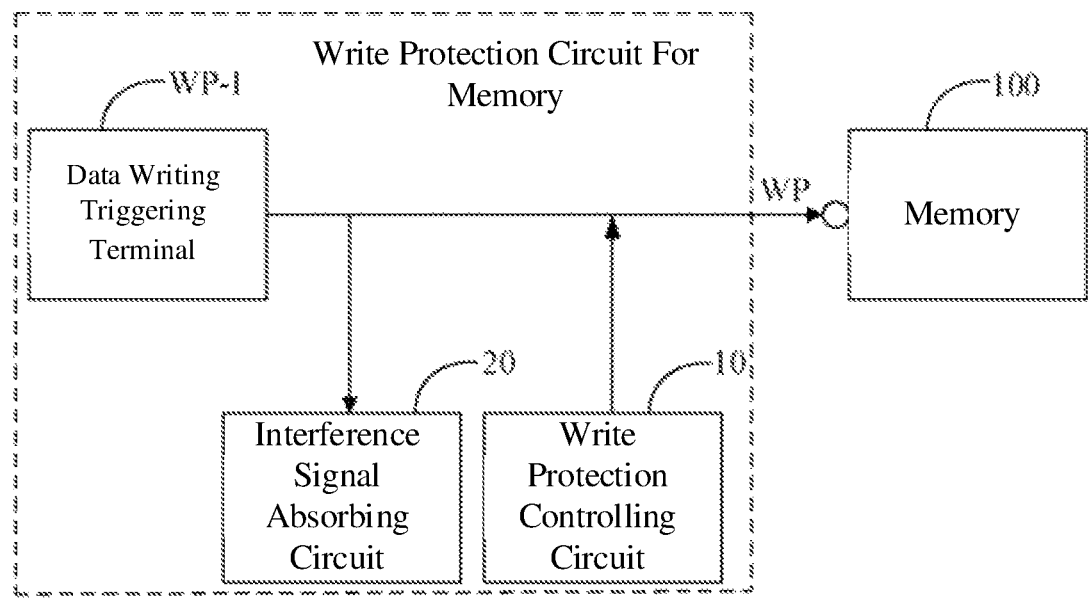
FIG. 1 is a schematic diagram illustrating a functional structure of an embodiment of a write protection circuit for memory according to the present disclosure.
Figure 2:
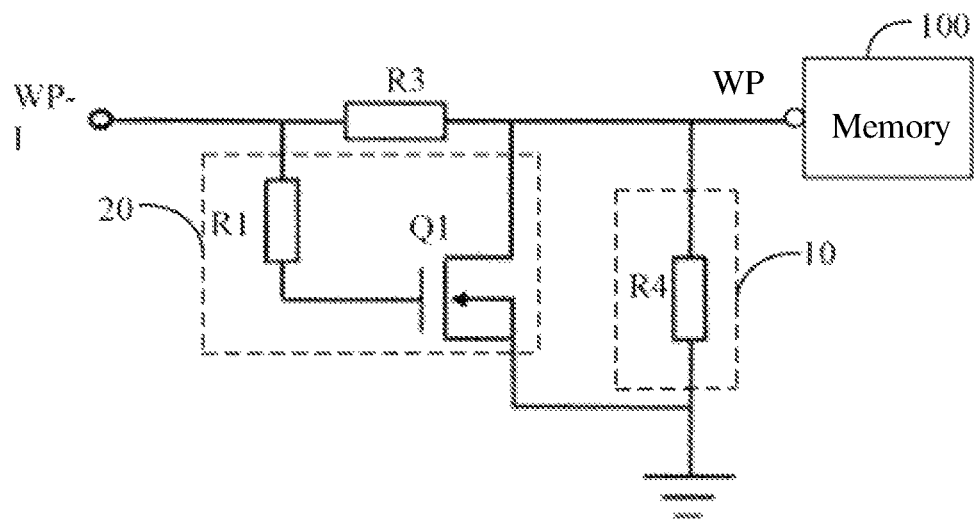
FIG. 2 is a schematic diagram illustrating a structure of an embodiment of a write protection circuit for memory according to the present disclosure.
Figure 3:
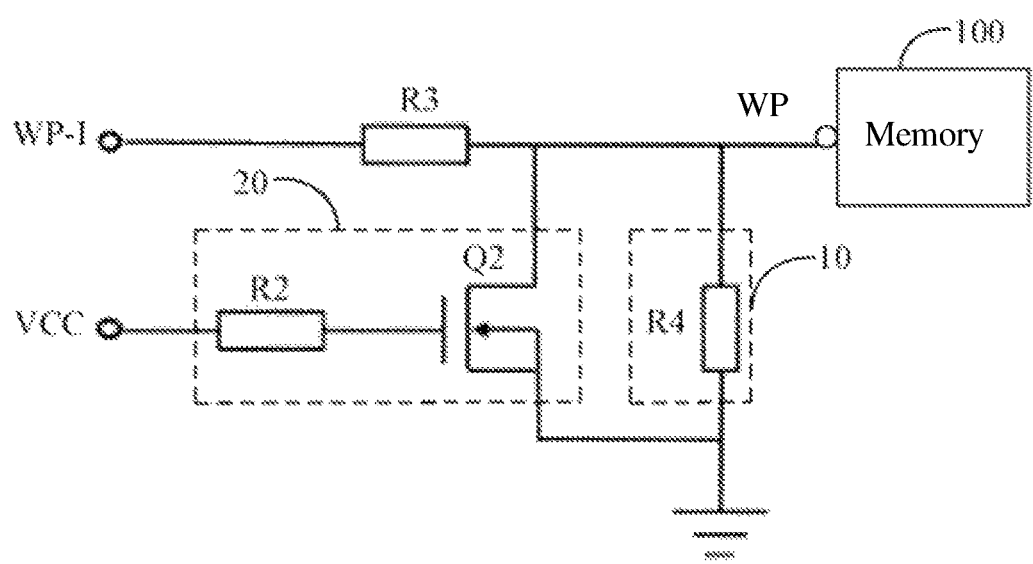
FIG. 3 is a schematic diagram illustrating a structure of another embodiment of a write protection circuit for memory according to the present disclosure.

Referring to FIG. 1-FIG. 3, in an embodiment of the present disclosure, the write protection circuit for memory includes:

a data writing triggering terminal WP-I connected with a write protection pin WP of a memory 100 and configured to receive a first level signal for controlling the memory 100 to enter into a write state;

a write protection controlling circuit 10 connected with the write protection pin WP of the memory 100 and configured to provide the write protection pin WP of the memory 100 with a second level signal for restricting the memory from being written with data, wherein the second level signal is opposite in polarity to the first level signal; and an interference signal absorbing circuit 20 connected with the data writing triggering terminal WP-I and configured to detect a level signal received by the data writing triggering terminal WP-I when the memory 100 functions normally and absorb the first level signal when the receiving of the first level signal by the data writing triggering terminal WP-I is detected.

In the embodiment, the first level signal may be a high level, the second level signal may be configured as a low level, or vice verse.

The memory 100, which may be arranged on a PCB of a Timing Controller (TCON), may store a control signal for driving a gate drive integrated circuit and a source drive integrated circuit to run and is connected in communication with the timing controller via an Inter-Integrated Circuit (I²C) communication bus, and when a display apparatus is powered on and functions, the timing controller reads the control signal in the memory 100 and other set data to perform an initial setting so as to generate a corresponding timing control signal to drive the source drive integrated circuit and the gate drive integrated circuit configured in a display panel in the display apparatus to function. Data in the memory 100 is not modifiable when the display apparatus functions normally, and once the data is modified, an error occurs in the set data, leading to an abnormal display of the display apparatus. Therefore, in most cases, the memory 100 is provided with a Write Protection Pin (WP pin), when a high level is input, the memory 100 can be controlled to be written with data, and when a low level is input, no data can be written into the memory 100, thereby performing write protection on the memory 100. Thus, in the embodiment, in the course of the normal functioning of the memory 100, a second level signal for restricting the memory 100 from being written with data is provided to the write protection pin WP of the memory 100 to perform the write protection on the memory 100.

It should be noted that the write protection generally refers to connecting a resistor in series between the write protection pin and the earth so that the data in the memory 100 is protected against being rewritten when the display apparatus functions normally. When the display apparatus is subjected to programming or a program update, the write protection pin WP, a clock pin and a data pin of the memory 100 are all connected with an electric connector and an upper machine through the I²C communication bus and a high-level signal input by the upper machine is received by the write protection pin WP so as to write a data signal into the memory 100 until the update is completed. However, after the program update is completed, it occurs frequently that noise (a high level surge) flees to the write protection pin WP, if the noise is a high level and an interference signal exists on the I²C communication bus, then the interference signal causes the memory 100 to malfunction, and data written with the interference signal causes software codes stored in the memory 100 to be rewritten.

To address the foregoing problem, the write protection circuit for memory according to the embodiment can be arranged on a main control panel of the display apparatus and performs the write protection on the memory 100 in the display apparatus to prevent a program, that is, software codes, stored in the memory 100 from being tampered with.

When connected with the electric connector in the display apparatus via the I²C communication bus to perform programming or a program update on the display apparatus, the data writing triggering terminal WP-I is connected with the upper machine via the I²C communication bus and the electric connector to supply a high-level write protection triggering signal to the write protection pin WP of the memory 100, at this time, the upper machine can be connected in communication with the memory 100 via the electric connector in the display apparatus and the I²C communication bus to rewrite the software codes in the memory 100.

The write protection controlling circuit 10 is connected with the write protection pin WP of the memory 100, that is, connected with a write protection triggering signal output terminal in parallel, so as to output a second level signal of low level to the write protection pin WP of the memory 100 when the display apparatus functions normally, that is, a level of the write protection pin WP included in pins of the memory 100 is pulled down by the write protection controlling circuit 10 to guarantee that the software codes in the memory 100 are not rewritten when the display apparatus is powered on and functions normally, thereby providing the write protection for the memory 100.

An input terminal of the interference signal absorbing circuit 20 is connected with the data writing triggering terminal WP-I, and when the display apparatus is powered on and functions normally, the write protection pin WP of the memory 100 is restricted by a low level, thereby performing the write protection. When detecting that a first level signal of high level is received by the data writing triggering terminal WP-I when the memory 100 functions normally, the interference signal absorbing circuit 20 determines that the first level signal is a high-level interference signal, and absorbs an interference signal fleeing from the I²C communication bus to the data writing triggering terminal WP-I, thus preventing a level of the write protection pin WP included in the pins of the memory 100 from being pulled up by the interference signal and consequentially avoiding that the interference signal on the I²C communication bus is supplied to a data transmission pin (a clock pin and a data pin) of the memory 100 through the I²C communication bus and rewrites the software codes of the memory 100. When the display apparatus needs to be updated in program, the interference signal absorbing circuit 20 is inactivated, and the upper machine communicates with the memory 100 normally to complete the witting of software codes into the memory 100.

The write protection controlling circuit for memory disclosed herein is provided with a write protection controlling circuit 10, which is connected with a write protection pin WP of the memory 100 to input, when the memory 100 functions normally, a write control signal to the write protection pin of the memory 100, and a data writing triggering terminal WP-I and a write protection triggering signal output terminal, which are connected with an electric connector and the write protection pin WP of the memory 100, respectively, to output, when data in the memory 100 is updated, an accessed write protection triggering signal to the write protection pin WP of the memory 100; the write protection controlling circuit for memory is also provided with an interference signal absorbing circuit 20, an input terminal of which is connected with the data writing triggering terminal WP-I to absorb, when a display apparatus is powered on and functions normally, an interference signal fleeing from an I²C communication bus to the data writing triggering terminal WP-I. The present disclosure addresses the problem that because a level of the write protection pin WP included in the pins of the memory 100 is pulled up by an interference signal, an interference signal on the I²C communication bus is supplied to a data transmission pin (a clock pin and a data pin) of the memory 100 through the I²C communication bus and rewrites software codes of the memory 100. The software codes of the memory 100 are effectively prevented from being rewritten.

Referring to FIG. 1-FIG. 3, in an optional embodiment, the interference signal absorbing circuit 20 is specifically configured to: detect a level signal received by the data writing triggering terminal WP-I when a first control signal is received which represents that the memory 100 functions normally, and absorb a first level signal when detecting that the first level signal is received by the data write triggering terminal WP-I.

In the embodiment, a circuit structure of the interference signal absorbing circuit 20 is specifically configured according to the type of a signal accessed to the first control signal. The first control signal may be a second level signal of low level, or a power supply signal.

Referring to FIG. 1 and FIG. 2, in a case where the first control signal is the second level signal of low level, when the memory 100 is powered on to function or functions normally, the write protection controlling circuit 10 outputs the second level signal of low level to the write protection pin WP to maintain the memory 100 in a write protection state. Synchronously, the second level signal is output to the interference signal absorbing circuit 20 to control the interference signal absorbing circuit to be inactivated.

The interference signal absorbing circuit 20 includes a first switch tube Q1 and a first resistor R1, wherein an input terminal of the first switch tube Q1 is interconnected with the data writing triggering terminal WP-I and a first terminal of the first resistor R1, a second terminal of the first resistor R1 is connected with a controlled terminal of the first electronic switch, and an output terminal of the first switch tube Q1 is earthed.

The first switch tube Q1, which may be implemented as a triode, an MOS tube, and the like in the embodiment, is optionally implemented as an N-MOS tube in the embodiment. The first resistor R1, whose resistance may be set to be 0 ohm, is arranged to provide a bias voltage to the N-MOS tube. When the display apparatus functions normally, no voltage is input to the electric connector and the I²C communication bus, that is, no signal is input to the data writing triggering terminal WP-I, in this case, the write protection controlling circuit 10 outputs a low-level write protection signal to the write protection pin WP of the memory 100 to maintain the memory 100 in the write protection state, and the second level signal of low level is output to a gate electrode of the N-MOS tube to cause the N-MOS tube to be in a cutoff state (VGS=0). When a noise signal, for example, a high-level surge signal, flees to the data writing triggering terminal WP-I, the first resistor R1 provides a bias voltage to the N-MOS tube to cause the N-MOS tube to be conductive (VGS>0); an interference signal is output to the earth via the N-MOS tube so that the write protection pin of the memory 100 is not in a high level state, moreover, at this time, the write protection controlling circuit 10 maintains a low level output to maintain the write protection pin WP of the memory 100 at a low level, that is, a write protection state is maintained, so that no codes can be written into the memory 100.

Referring to FIG.1 and FIG. 3, when the first control signal is a high-level power supply signal, the write protection circuit for memory further includes a power input terminal VCC, a controlled terminal of the interference signal absorbing circuit 20 is connected with the power input terminal VCC, which may be connected to a power supply of the memory 100, for example, a direct current power supply of 3.3V, and when the memory 100 is powered on and functions, the interference signal absorbing circuit 20 is supplied with the power supply to function and absorb the first level signal of high level received by an input terminal thereof.

The interference signal absorbing circuit 20 includes a second switch tube Q2 and a second resistor R2, wherein an input terminal of the second switch tube Q2 is connected with the data writing triggering terminal WP-I, a controlled terminal of the second switch tube Q2 is connected with the power input terminal VCC via the second resistor R2, and an output terminal of the second switch tube Q2 is earthed.

The second switch tube Q2, which may be implemented as a triode, an MOS tube, and the like in the embodiment, is optionally implemented as an N-MOS tube in the embodiment. The second resistor R2 is a current limiting resistor, which is configured to prevent a current output to the controlled terminal of the second switch tube Q2 from being too large to damage a switch tube. The power input terminal VCC is configured to receive a control signal to control the switching-on of the second switch tube Q2, the power input terminal VCC may be connected with a power input terminal VCC of the memory 100 in parallel to be connected with the power supply of the memory 100, for example, a direct current power supply of 3.3V, after the display apparatus is powered on, the second switch tube Q2 is switched on to short-circuit the data write triggering terminal WP-I and the earth. With this arrangement, an interference signal fleeing into the data writing triggering terminal WP-I, if any, is output to the earth via the N-MOS tube, thus avoiding that the write protection pin WP of the memory 100 is in a high level state, moreover, at this time, the write protection controlling circuit 10 maintains a low level output to maintain the write protection pin WP of the memory 100 at a low level, that is, maintain the write protection state, so that no codes can be written into the memory 100.

Referring to FIG. 1-FIG. 3, in an optional embodiment, the write protection circuit for memory further includes a current limiting element (not shown), which is arranged in series between the data writing triggering terminal WP-I and the write protection pin WP of the memory 100.

The current limiting element, which may be implemented as a current limiter such as a capacitor, a resistor, or the like in the embodiment, is optionally implemented as a third resistor R3 in the embodiment, the third resistor R3 is arranged in series between the data writing triggering terminal WP-I and the write protection pin WP of the memory 100. In the embodiment, the third resistor R3 is a pull-up resistor, which guarantees, when the data writing triggering terminal WP-I is connected with the upper machine via the I²C communication bus and the electric connector and supplies a high-level write protection triggering signal to the write protection pin WP of the memory 100, an output of a high-level signal to the write protection pin WP to trigger the memory 100 to enter into a writable state.

Referring to FIG. 1-FIG. 3, in an optional embodiment, the write protection controlling circuit 10 includes a fourth resistor R4, which is arranged in series between the write protection pin WP of the memory 100 and the earth.

Further, in the embodiment, the ratio of a resistance of the third resistor R3 to that of the fourth resistor R4 is 1:12-1:6. In the embodiment, it can be appreciated that the third resistor R3 is connected with the fourth resistor R4 in series to divide a voltage so as to guarantee, when the data writing triggering terminal WP-I is connected with the upper machine via the I²C communication bus and the electric connector and supplies a high-level write protection triggering signal to the write protection pin WP of the memory 100, an output of a high-level signal to the write protection pin WP to trigger the memory 100 to enter into a writable state.

It should be noted that when the memory 100 needs to be updated in program, that is, when codes needs to be written into the memory 100, a high level should be guaranteed for the write protection pin WP of the memory 100 while a supply voltage of the memory 100 is generally 3.3V, thus, the write protection triggering signal generally needs to be set to be 2.7-3.6V so that the memory 100 can read the voltage signal as a high level signal. A voltage connected to the electric connector is generally 3.3V, after the voltage is divided by connecting the third resistor R3 with the fourth resistor R4 in series, it should be guaranteed that a voltage connected to the write protection pin WP of the memory 100 is maintained at 2.7-3.6V, in the embodiment, according to a voltage division principle, when the ratio of a resistance of the R3 to that of the resistor R4 is set to be 1:12 to 1:6, it can be guaranteed that the actual voltage of the write protection pin WP is at a high level after a voltage is divided by the third resistor R3 and the fourth resistor R4. Further, in the embodiment, the ratio of a resistance of the third resistor R3 to that of the fourth resistor R4 is 1:10.

The present disclosure further provides a display apparatus including the foregoing write protection circuit for memory. A specific structure of the write protection circuit for memory can be understood with reference to the foregoing embodiments and is not described here redundantly; it is to be appreciated that due to the use of the write protection circuit for memory in the display apparatus disclosed herein, embodiments of the display apparatus disclosed herein include all the technical solutions of all the embodiments of the write protection circuit for memory and achieve the same technical effects with the embodiments of the write protection circuit for memory and are therefore not describe here redundantly.

The embodiments above are merely preferably embodiments of the present disclosure but are not to be construed as limiting the scope of the present disclosure, and any equivalent structural conversion devised based on the inventive concept of the present disclosure or using the drawing of the present disclosure, or a direct or indirect application of the present disclosure to another related technical field shall fall into the scope of protection of the present disclosure.

What is claimed is:

1. A write protection circuit for memory, comprising:
a data writing triggering terminal connected with a write protection pin of a memory and configured to receive a first level signal for controlling the memory to enter into a write state;
a write protection controlling circuit connected with the write protection pin of the memory and configured to provide the write protection pin of the memory with a second level signal for restricting the memory from being written with data, wherein the second level signal is opposite in polarity to the first level signal; and
an interference signal absorbing circuit connected with the data writing triggering terminal and configured to detect a level signal received by the data writing triggering terminal when the memory functions normally and absorb the first level signal when the receiving of the first level signal by the data writing triggering terminal is detected.

2. The write protection circuit for memory according to claim 1, wherein the interference signal absorbing circuit is specifically configured to detect the level signal received by the data writing triggering terminal when a first control signal representing a normal functioning of the memory is received and absorb the first level signal when the receiving of the first level signal by the data writing triggering terminal is detected.

3. The write protection circuit for memory according to claim 2, wherein the interference signal absorbing circuit comprises a first switch tube and a first resistor, an input terminal of the first switch tube is connected with the data writing triggering terminal and a first terminal of the first resistor, a second terminal of the first resistor is connected with a controlled terminal of the first switch tube, and an output terminal of the first switch tube is grounded.

4. The write protection circuit for memory according to claim 3, wherein the first switch tube is an N-MOS tube.

5. The write protection circuit for memory according to claim 2, further comprising a power input terminal, wherein the interference signal absorbing circuit comprises a second switch tube and a second resistor, an input terminal of the second switch tube is connected with the data writing triggering terminal, a controlled terminal of the second switch tube is connected with the power input terminal via the second resistor, and an output terminal of the second switch tube is grounded.

6. The write protection circuit for memory according to claim 5, wherein the power input terminal is connected in parallel with a power input terminal of the memory to receive a power supply of the memory.

7. The write protection circuit for memory according to claim 5, wherein the second switch tube is an N-MOS tube.

8. The write protection circuit for memory according to claim 1, further comprising a current limiting element, which is connected in series between the data writing triggering terminal and the write protection pin of the memory.

9. The write protection circuit for memory according to claim 8, wherein the current limiting element is a third resistor, which is connected in series between the data writing triggering terminal and the write protection pin of the memory.

10. The write protection circuit for memory according to claim 9, wherein the write protection controlling circuit further comprises a fourth resistor, which is connected in series between the write protection pin of the memory and a ground.

11. The write protection circuit for memory according to claim 10, wherein the third resistor and the fourth resistor are connected in series.

12. The write protection circuit for memory according to claim 10, wherein the third resistor and the fourth resistor are configured to control, when the data writing triggering terminal is connected with an upper machine via an I²C communication bus and an electric connector and supplies a high-level write protection triggering signal to the write protection pin of the memory, an output of a high-level signal to the write protection pin to trigger the memory to enter into a writable state.

13. The write protection circuit for memory according to claim 10, wherein a ratio of a resistance of the third resistor to that of the fourth resistor is 1:12-1:6.

14. The write protection circuit for memory according to claim 11, wherein a ratio of a resistance of the third resistor to that of the fourth resistor is 1:10.

15. A write protection circuit for memory, comprising:
a first resistor connected with a write protection pin of a memory and configured to input a low-level write control signal to the write protection pin of the memory when the memory functions normally;
a data writing triggering terminal connected with the write protection pin of the memory and configured to output a received high-level write protection triggering signal to the write protection pin of the memory when the memory is updated in data; and
an interference signal absorbing circuit connected with the data writing triggering terminal, and configured to detect a level signal received by the data writing triggering terminal when the memory functions normally and absorb the received high-level write protection triggering signal when the receiving of the high-level write protection triggering signal by the data writing triggering terminal is detected.

16. A display apparatus comprising a write protection circuit for memory, wherein, the write protection circuit for memory comprises:

a data writing triggering terminal connected with a write protection pin of a memory and configured to receive a first level signal for controlling the memory to enter into a write state;

a write protection controlling circuit connected with the write protection pin of the memory and configured to provide the write protection pin of the memory with a second level signal for restricting the memory from being written with data, wherein the second level signal is opposite in polarity to the first level signal; and an interference signal absorbing circuit connected with the data writing triggering terminal and configured to detect a level signal received by the data writing triggering terminal when the memory functions normally and absorb the first level signal when the receiving of the first level signal by the data writing triggering terminal is detected.

17. The display apparatus according to claim 16, further comprising an Inter-Integrated Circuit (I²C) communication bus and a timing controller, wherein the memory is connected with the timing controller via the I²C communication bus.

18. The display apparatus according to claim 17, further comprising a display panel, a source drive integrated circuit and a gate drive integrated circuit, wherein the timing controller is connected with the source drive integrated circuit and the gate drive integrated circuit, and the source drive integrated circuit and the gate drive integrated circuit are also connected with the display panel.

19. The display apparatus according to claim 16, wherein the interference signal absorbing circuit is specifically configured to detect the level signal received by the data writing triggering terminal when a first control signal representing a normal functioning of the memory is received and absorb the first level signal when the receiving of the first level signal by the data writing triggering terminal is detected.

20. The display apparatus according to claim 19, wherein the write protection circuit for memory further comprises a power input terminal, the interference signal absorbing circuit comprises a second switch tube and a second resistor, an input terminal of the second switch tube is connected with the data writing triggering terminal, a controlled terminal of the second switch tube is connected with the power input terminal via the second resistor, and an output terminal of the second switch tube is grounded.

* * * * *